US008523372B2

(12) United States Patent
Wegat

(10) Patent No.: US 8,523,372 B2
(45) Date of Patent: Sep. 3, 2013

(54) LIGHTING SYSTEMS

(75) Inventor: James Wegat, Covington, WA (US)

(73) Assignee: IDD Aerospace Corporation, Redmond, WA (US)

( * ) Notice: Subject to any disclaimer, the term of this patent is extended or adjusted under 35 U.S.C. 154(b) by 766 days.

(21) Appl. No.: 12/611,130

(22) Filed: Nov. 3, 2009

(65) Prior Publication Data
US 2010/0118511 A1 May 13, 2010

Related U.S. Application Data

(60) Provisional application No. 61/112,228, filed on Nov. 7, 2008.

(51) Int. Cl.
*F21V 9/16* (2006.01)

(52) U.S. Cl.
USPC ........ 362/84; 362/231; 362/249.02; 362/260; 362/293; 362/311.02; 362/470

(58) Field of Classification Search
USPC ......... 362/84, 231, 249.02, 260, 293, 311.02, 362/470–472
See application file for complete search history.

(56) References Cited

U.S. PATENT DOCUMENTS

| 4,228,490 A * | 10/1980 | Thillays ............. 362/311.04 |
| 5,140,384 A | 8/1992 | Tanaka |
| 5,600,181 A | 2/1997 | Scott et al. |
| 5,777,433 A | 7/1998 | Lester et al. |
| 5,986,317 A | 11/1999 | Wiese |
| 6,777,706 B1 | 8/2004 | Tessler et al. |
| 6,786,617 B2 | 9/2004 | Lemay et al. |
| 6,803,719 B1 | 10/2004 | Miller et al. |
| 6,876,006 B1 | 4/2005 | Matveev et al. |
| 6,921,929 B2 | 7/2005 | LeBoeuf et al. |
| 7,081,991 B2 * | 7/2006 | Jones et al. ............. 362/800 |
| 7,083,490 B2 | 8/2006 | Mueller et al. |
| 7,183,588 B2 | 2/2007 | Chia et al. |
| 7,374,807 B2 | 5/2008 | Parce et al. |
| 7,427,523 B2 | 9/2008 | Boardman et al. |
| 2003/0168670 A1 | 9/2003 | Roberts et al. |
| 2004/0145893 A1 | 7/2004 | Lemay et al. |
| 2004/0179283 A1 | 9/2004 | Jones et al. |
| 2006/0108594 A1 | 5/2006 | Iwasaki et al. |
| 2007/0257272 A1 | 11/2007 | Hutchins |

FOREIGN PATENT DOCUMENTS

| CN | 100428020 | 10/2008 |
| EP | 1624324 | 2/2006 |
| EP | 2071643 | 6/2009 |
| FR | 2870359 | 11/2005 |
| JP | 07193282 | 7/1995 |
| WO | WO-03006876 | 1/2003 |
| WO | WO-2005067524 | 7/2005 |
| WO | WO2007078971 | 7/2007 |
| WO | WO2007130912 | 11/2007 |

* cited by examiner

*Primary Examiner* — Stephen F Husar
(74) *Attorney, Agent, or Firm* — Dean W. Russell; Kilpatrick Townsend & Stockton LLP

(57) ABSTRACT

Assemblies compliant with night vision imaging system (NVIS) standards are described. Versions of the assemblies incorporate filtering material into an encapsulant for a light-emitting diode (LED) die, avoiding any necessity of using external filtering agents. Alternatively or additionally, filtering material may be incorporated into a housing of an encapsulated LED.

10 Claims, 1 Drawing Sheet

LIGHTING SYSTEMS

REFERENCE TO PROVISIONAL APPLICATION

This application is based on, claims priority to, and hereby refers to U.S. Provisional Patent Application Ser. No. 61/112,228, filed Nov. 7, 2008, entitled "Night Vision LEDs," the entire contents of which are incorporated herein by this reference.

FIELD OF THE INVENTION

The present invention relates to lighting systems and more particularly, although not necessarily exclusively, to lighting systems compliant with requirements for night vision imaging systems (NVISs) or compatible with NVIS equipment.

BACKGROUND OF THE INVENTION

Cockpit lighting demands for military or other professional aircraft may be impacted by nighttime, or other low light, operations. In particular, at times during operation of the aircraft, flight crews may have donned night vision goggles or similar equipment to enhance visibility of terrain and other features outside the aircraft. Because these goggles are sensitive to infrared and near-infrared radiation, cockpit illumination often must be designed to minimize output in these regions of the lighting spectrum. Illumination of this type that meets military or other recognized standards in this area is frequently referred to as "NVIS compliant."

U.S. Pat. No. 6,786,617 to Lemay, et al., whose contents are incorporated herein in their entirety by this reference, discusses use of light-emitting diodes (LEDs) for these purposes. Although LEDs are advantageous over incandescent lighting in many ways, visible-wavelength LEDs can also emit energy in the infrared and near-infrared portions of the spectrum and thus must have their light filtered for use with NVIS equipment. Accordingly, the Lemay patent describes an assembly of green and blue LEDs whose light is filtered to be NVIS compliant. See Lemay, col. 2, ll. 47-58. As detailed in the Lemay patent:

It is another object of this invention to provide an electronic component for use in a night vision imaging system environment comprising a printed circuit board assembly comprising a light source having an emission non-compliant to the night vision imaging system standard, a conformal coating covering the printed circuit board assembly, including an absorbing agent, for filtering quantities of energy of the emission, such that the infrared emission of the printed circuit board assembly is filtered by the absorbing agent.

Id., col. 3, ll. 1-9.

Illustrated in FIG. 2 of the Lemay patent is "a typical assembly of light emitting diodes producing light compliant with a night vision imaging system standard." Id., ll. 28-30. Shown in the figure are two LEDs (green and blue) assembled on a printed circuit board and coated externally with a conformal coating to which absorbing dye has been added. An optical filter and diffusing film may also be positioned atop the LEDs, with the conformal coating instead applied to the diffusing film in an alternative version of the assembly. See id., col. 5, ll. 7-48. Absent inclusion of (at least) the external conformal coating with its absorbing dye, the assembly would not be NVIS compliant.

FIG. 1 of this application depicts a conventional system similar to that of the Lemay patent. As shown in FIG. 1, a standard surface-mount LED package 10 includes an encapsulated LED die 14 positioned within a housing 18, with the encapsulant 22 typically comprising phosphor 26. An external filtering dye or pigment 30 (which may be in the form of a doped glass or polymeric film) is then coated onto or bonded to the exterior of the housing 18. In yet other existing systems, the filtering material is separated from—but still external to—the housing of the LED.

Unaddressed by these or any other existing NVIS-compliant systems known to applicant is the concept of providing filtering material internal to an LED package. Such concept avoids any necessity of coating or bonding external filters to the package, reducing manufacturing time and expense. It also reduces the possibility of the external filtering material abrading or otherwise wearing in use.

SUMMARY OF THE INVENTION

The present invention provides systems with internal filtering that are NVIS-compliant or, at least, compatible with NVIS equipment. Certain presently-preferred versions of the systems incorporate filtering material into the encapsulant for an LED. Additionally or alternatively incorporated into the encapsulant may be phosphor or quantum dots. Although not presently preferred, systems of the present invention alternatively or additionally could incorporate filtering material into the housing of the encapsulated LED. In any circumstance, common to all of these systems is that need for an external filtering agent is eliminated.

In at least one presently-preferred version of the invention, both phosphor and an absorber of infrared and near-infrared energy, in the form of a dye or pigment, are incorporated into the encapsulant of a blue (or other wavelength) LED die. The encapsulated die is then positioned within a housing (typically, but not necessarily, made of polymeric material or ceramic). Alternatively, component assembly may occur in any other appropriate order. The preferred result, in any event, is an NVIS-compliant LED ready for installation and use.

It thus is an optional, non-exclusive object of the present invention to provide lighting systems that are NVIS compliant or, at least, compatible with NVIS equipment.

It is another optional, non-exclusive object of the present invention to provide NVIS-compliant lighting systems utilizing one or more LEDs.

It is an additional optional, non-exclusive object of the present invention to provide NVIS-compliant lighting systems in which only a single LED die need be included in an LED package.

It is a further optional, non-exclusive object of the present invention to provide lighting systems in which filtering material external to an LED package is not required to achieve NVIS compliance.

It is also an optional, non-exclusive object of the present invention to provide lighting systems in which filtering material is incorporated into either or both of an encapsulant of an LED die or a housing of the encapsulated die.

It is, moreover, an optional, non-exclusive object of the present invention to provide lighting systems in which energy-absorbing filtering material is incorporated into an encapsulant together with phosphor or quantum dots (or both).

Other objects, features, and advantages will be apparent to those skilled in appropriate fields with reference to the remaining text and the drawings of this application.

DETAILED DESCRIPTION

Figure 1:
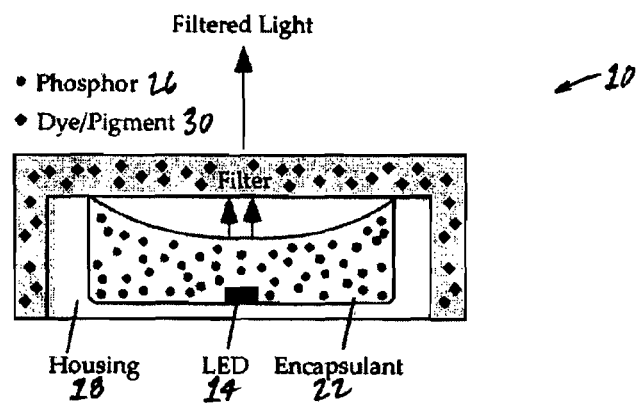
FIG. 1 is a schematicized view of an existing LED package with external filtering material.

Unlike the assembly of FIG. 1 discussed above, exemplary assembly 50 of FIG. 2 preferably omits external filtering dye or pigment 30. This omission simplifies creation of NVIS-compliant or compatible lighting systems, as assembly 50 need not be coated with (or otherwise processed to include) an external filtering agent to ensure NVIS compliance. Avoiding any need for use of an external filtering agent also reduces time and expense associated with processing assembly 50, as the assembly 50 effectively may be supplied usage-ready without modification.

Assembly 50 may comprise LED die 54, encapsulant 58, and housing 62. For most cockpit illumination systems, die 54 preferably—although not necessarily—will be blue, green, or red. Encapsulant 58 may encapsulate die 54, with both encapsulant 58 and die 54 being housed in housing 62.

Figure 2:
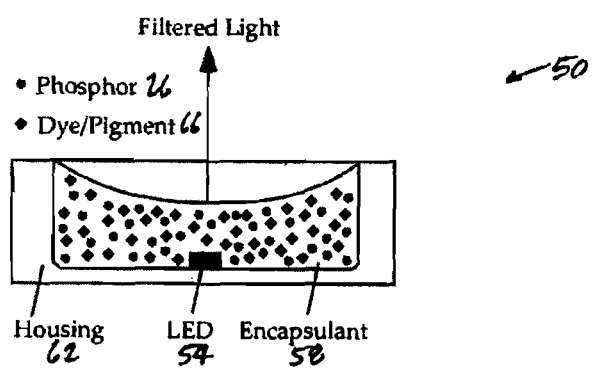
FIG. 2 is a schematicized view of an exemplary LED package of the present invention omitting external filtering material.

Like the assembly of FIG. 1, assembly 50 too preferably contains filtering material. Such filtering material 66 is illustrated in FIG. 2 as dye or pigment configured to absorb at least some energy in either or both of the infrared and near-infrared portions of the light spectrum. It may absorb some energy in the visible portion of the light spectrum as well. Material 66 need not necessarily be dye or pigment or in the form of a doped film, however; instead, it may comprise any agent and structure satisfactory for reducing emissions of die 54 in one or more regions of the spectrum.

Filtering material 66 is, however, incorporated into encapsulant 58. It thus is internal to housing 62, rather than external to housing 18 as shown in FIG. 1 or to the LED packages of the Lemay patent. Also shown as incorporated into encapsulant 58 is phosphor 26, although inclusion of phosphor 26 is optional in some embodiments of assembly 50. Alternatively or additionally, quantum dots may be incorporated into encapsulant 58. In any event, preferred versions of assembly 50 are NVIS compliant.

Certain alternate versions of assembly 50 incorporate filtering material 66 into housing 62. This filtering material 66 may be in lieu of or in addition to that discussed in the preceding paragraph. It nevertheless continues to be internal to assembly 50 as opposed to the external coatings of existing systems. Other alternate versions of assembly 50 may involve coating die 54 directly with phosphor 26 while continuing to incorporate filtering material 66 into encapsulant 58. Yet other versions of assembly 50 contemplate injecting a mixture of phosphor 26 and filtering material into encapsulant 58 in a manner permitting the (higher) specific gravity of phosphor 26 to cause it to settle onto die 54.

Assembly 50 may, if desired, be attached to a printed circuit board similar to the system of the Lemay patent. However, because assembly 50 typically is already NVIS compliant, at least the conformal coating of the Lemay patent is unnecessary. (Although unnecessary, such conformal coating may, however, be added to assembly 50 if desired.) Likewise, if desired, the diffusing film and optical filter of the Lemay patent may also be used with assembly 50.

Any number of LED packages of the present invention, on or off any number of integrated circuits or printed circuit boards, may be included in lighting systems of the present invention. Notably, however, an assembly 50 of the present invention may include as few as one LED die 54, whereas assemblies of the Lemay patent require a minimum of two LED dies (one blue, one green). Assembly 50 nevertheless may include both blue and green (or other color) LED dies if desired, as the concept of incorporating filtering material 66 into encapsulant 58 (or into housing 62) is independent of the type of die 54 included.

The foregoing is provided for purposes of illustrating, explaining, and describing embodiments of the present invention. Modifications and adaptations to these embodiments will be apparent to those skilled in the art and may be made without departing from the scope or spirit of the invention.

What is claimed is:

1. An assembly comprising:
   a. an emitter of light;
   b. an encapsulant configured to encapsulate the emitter and incorporating (i) phosphor and (ii) means for filtering light emitted from the emitter; and
   c. a housing containing the emitter and the encapsulant.

2. An assembly according to claim 1 in which the emitter is an LED die.

3. An assembly according to claim 2 in which the filtering means comprises means for filtering either or both of infrared or near-infrared emissions of the LED die.

4. An assembly according to claim 3 in which the filtering means comprises a dye or pigment.

5. An assembly according to claim 4 in which the LED die is blue, green, or red.

6. An assembly according to claim 5 omitting any light-filtering means external to the housing.

7. An assembly according to claim 6 omitting any second LED die.

8. An assembly according to claim 1 in which light emitted from the emitter is not NVIS compliant but is NVIS compliant after filtering by the filtering means.

9. An assembly according to claim 2 further comprising a printed circuit board to which the housing is directly or indirectly attached.

10. An assembly comprising:
    a. an emitter of light;
    b. an encapsulant configured to encapsulate the emitter and incorporating (i) at least one quantum dot and (ii) means for filtering light emitted from the emitter; and
    c. a housing containing the emitter and the encapsulant.

* * * * *